(12) United States Patent
Okita

(10) Patent No.: US 6,774,453 B2
(45) Date of Patent: Aug. 10, 2004

(54) SEMICONDUCTOR DEVICE, IMAGE PICKUP DEVICE USING THE SAME, AND PHOTOELECTRIC CONVERSION DEVICE

(75) Inventor: Akira Okita, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/369,551

(22) Filed: Feb. 21, 2003

(65) Prior Publication Data

US 2003/0160295 A1 Aug. 28, 2003

(30) Foreign Application Priority Data

Feb. 28, 2002 (JP) ........................................ 2002/053945

(51) Int. Cl.$^7$ .............................................. H01L 29/92
(52) U.S. Cl. ..................... 257/506; 257/291; 257/292; 257/443; 257/446; 257/461
(58) Field of Search ................................. 257/291, 292, 257/443, 446, 461, 506

(56) References Cited

U.S. PATENT DOCUMENTS 6,281,533 B1   8/2001   Miyagawa et al. ......... 257/290
6,423,993 B1 * 7/2002   Suzuki ........................ 257/292

FOREIGN PATENT DOCUMENTS

JP          10-98176       4/1998

* cited by examiner

*Primary Examiner*—Edward Wojciechowicz
(74) *Attorney, Agent, or Firm*—Fitzpatrick, Cella, Harper & Scinto

(57) ABSTRACT

Provided is a semiconductor device includes a semiconductor element having a first semiconductor region of a first conductivity type and a second semiconductor region of a second conductivity type which is formed in the first semiconductor region, an element isolation layer formed between the semiconductor element and an adjacent element, a third semiconductor region of the first conductivity type having a higher concentration than the first semiconductor region formed under the element isolation layer, and a conductor layer formed on a portion of the element isolation layer, in which a fourth semiconductor region of the first conductivity type having a higher concentration than the third semiconductor region is further provided in at least a portion of a region opposite to the conductor layer through the element isolation layer and wiched there between.

17 Claims, 11 Drawing Sheets

SEMICONDUCTOR DEVICE, IMAGE PICKUP DEVICE USING THE SAME, AND PHOTOELECTRIC CONVERSION DEVICE

BACKGROUND OF THE INVENTION

1. Field of the Invention

The present invention relates to a semiconductor device, a photoelectric conversion device, an amplification type solid state image pickup device using the same, and a system using the same. In particular, the present invention relates to an image pickup device such as a digital camera, a video camera, a copying machine, or a facsimile and a system therefor.

2. Related Background Art

A large number of image sensors, each of which has solid state image pickup elements including a photoelectric conversion element arranged in one-dimension or two-dimension, are mounted in a digital camera, a video camera, a copying machine, a facsimile, or the like. Examples of the solid state image pickup element include a CCD image pickup element and an amplification type solid state image pickup element.

These image pickup elements tend to increase the number of pixels formed therein. In addition, a photo diode area is accordingly reduced as an area of a pixel decreases. Thus, the need for treating the smaller amount of signal charge and the need for minimizing a leak current of a photo diode resulting from a noise component arise.

A circuit structural example of an amplification type solid state image pickup element is shown in FIG. 15. In the amplification type solid state image pickup element, a unit pixel has at least a photo diode PD and a transistor Tr for amplifying a photo signal stored in the photo diode. The pixel structure is the same as in a pixel structure shown in FIG. 3 as described later. Signal readout and reset operations of respective pixels to a pixel row are controlled by a vertical scanning circuit (VSR). The read signals are stored in capacitors C and outputted for each pixel column in succession from a horizontal output line by a horizontal scanning circuit (HSR).

FIG. 16 shows a sectional structure of a photo diode in a unit cell of a conventional amplification type MOS sensor. As shown in FIG. 16, an n-type region 103 composing a photo diode together with a p-type semiconductor layer 102 on an n-type substrate 101 is formed in a self-aligning manner with a selective oxide layer 104 as an element isolation layer. Thus, it is constructed such that an area of the n-type region 103 corresponding to an area of the photo diode is increased to a limit. A P+ type channel stop region 106 for improving a punch-through withstand voltage between a source drain region 107 of an adjacent MOS transistor and the n-type region 103 of the photo diode is formed under the selective oxide layer 104. In addition, a wiring layer 105 of a transistor is formed on the selective oxide layer 104.

However, in FIG. 16, when a potential of the wiring layer 105 of the transistor is set to a HIGH level (for example, +5 V), an effective concentration of the p+ type channel stop region 106 located thereunder is reduced and a minority carrier concentration in a region under the wiring layer 105 is increased. When the minority carrier (electron) is diffused into the photo diode, a dark current of the photo diode is increased.

For measures against this, it is considered that the concentration of the P+ type channel stop region is increased.

However, a junction withstand voltage with an N++ region of the adjacent source drain region 107 is reduced or an interjunction leak current is increased.

On the other hand, it is considered that the selective oxide layer 104 is made thick. However, when it is made thick, a step of the wiring layer 105 becomes larger. Thus, there is the case where disconnection or short circuit is easy to cause. Therefore, it is inconvenience for the formation of minute wiring.

Accordingly, there is a problem in that a noise is increased by the increase of a dark current so that the deterioration of S/N ratio is caused.

SUMMARY OF THE INVENTION

In order to solve the above-mentioned problem, a semiconductor device according to the present invention includes: a semiconductor element having a first semiconductor region of a first conductivity type and a second semiconductor region of a second conductivity type which is formed in the first semiconductor region; an element isolation layer formed between the semiconductor element and an adjacent element; a third semiconductor region of the first conductivity type having a higher concentration than the first semiconductor region formed under the element isolation layer; and a conductor layer formed on a portion of the element isolation layer, in which a fourth semiconductor region of the first conductivity type having a higher concentration than the third semiconductor region is further provided in at least a portion of a region opposite to the conductor layer through the element isolation layer sandwiched therebetween.

Further, a photoelectric conversion device according to the present invention includes: a photoelectric conversion element having a first semiconductor region of a first conductivity type and a second semiconductor region of a second conductivity type which is formed in the first semiconductor region; an element isolation layer formed between the photoelectric conversion element and an adjacent element; a third semiconductor region of the first conductivity type having a higher concentration than the first semiconductor region formed under the element isolation layer; and a conductor layer formed on a portion of the element isolation layer, in which a fourth semiconductor region of the first conductivity type having a higher concentration than the third semiconductor region is further provided in at least a portion of a region opposite to the conductor layer through the element isolation layer sandwiched therebetween.

DESCRIPTION OF THE PREFERRED EMBODIMENTS

Hereinafter, embodiments of the present invention will be described. Note that the present invention can be applied to semiconductor devices in general. In the following descriptions, a photoelectric conversion device and an image pickup device are indicated as examples.

Embodiment 1

Figure 1:
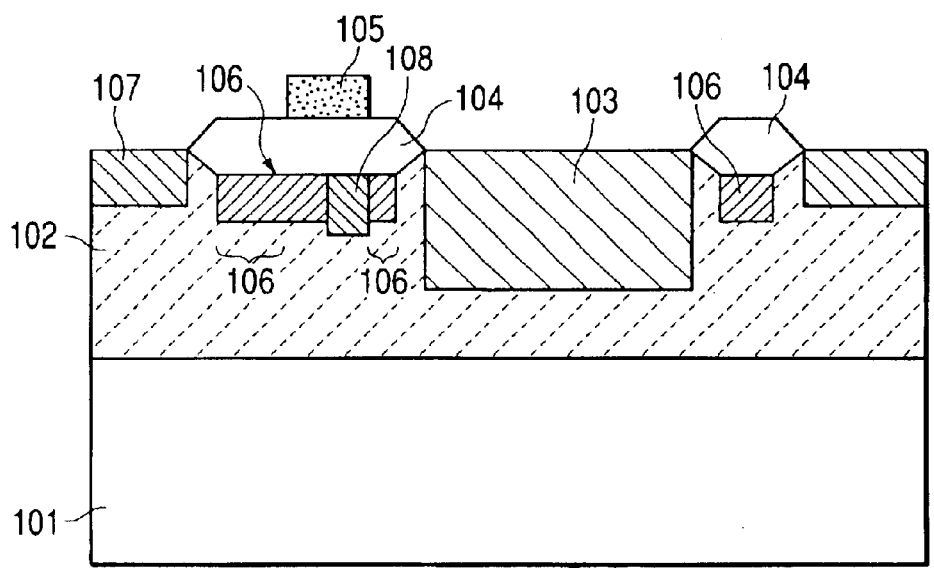
FIG. 1 is a schematic sectional view of Embodiment 1 of a photoelectric conversion device of the present invention.
Figure 2:
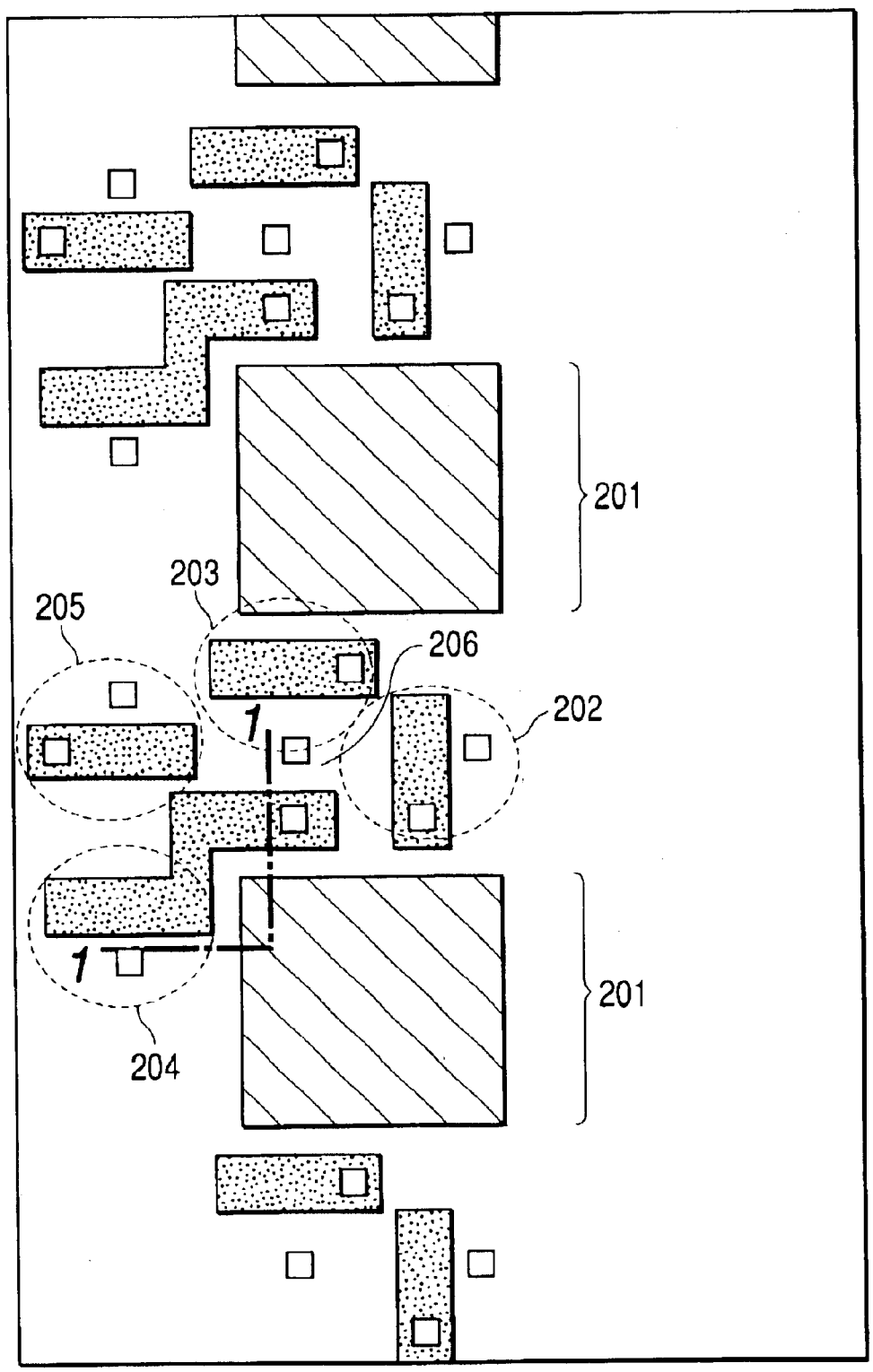
FIG. 2 is a plan view of Embodiment 1 of the photoelectric conversion device of the present invention.
Figure 3:
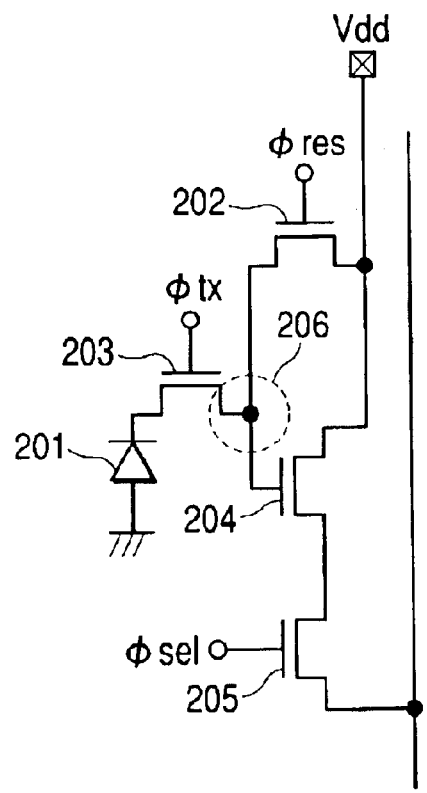
FIG. 3 is an equivalent circuit diagram of a pixel formed in the photoelectric conversion device of the present invention.

FIG. 1 is a schematic sectional view of Embodiment 1 of a photoelectric conversion device of the present invention along a line 1—1 shown in FIG. 2. FIG. 2 is a plan view of the photoelectric conversion device of the present invention. FIG. 3 is an equivalent circuit diagram of, a pixel formed in the photoelectric conversion device of the present invention.

In FIG. 1, reference numeral 101 denotes a semiconductor substrate of, for example, an n-type, 102 denotes a P-type semiconductor layer as a first semiconductor region of a first conductivity type, and 103 denotes an N-type semiconductor region as a second semiconductor region of a second conductivity type. The semiconductor layer 102 and the semiconductor region 103 compose a photo diode serving as a photoelectric conversion element. Reference numeral 104 denotes element isolation layer, 105 denotes a wiring layer as a conductor layer, and 106 denotes P+ type channel stop regions as third semiconductor regions of the first conductivity type, which have a higher concentration than the P-type semiconductor layer 102 and are provided under the element isolation layer 104. Reference numeral 107 denotes a source or drain region of an adjacent MOS transistor. Reference numeral 108 denotes a P++ type dark current reducing region as a fourth semiconductor region of the first conductivity type, which has a further higher concentration than the P+ type channel stop regions 106.

Next, a circuit construction will be described using FIGS. 2 and 3. In FIGS. 2 and 3, reference numeral 201 denotes a photo diode as a photoelectric conversion element for conducting photoelectric conversion (the photo diode 201 shown in FIG. 2 corresponds to the N-type semiconductor region 103 shown in FIG. 1), 202 denotes a reset transistor for resetting the photo diode 201 and a floating diffusion (FD) region 206, and 203 denotes a transfer MOS transistor for reading out a signal charge of the photo diode 201. In addition, reference numeral 204 denotes a source follower amplifier (MOS transistor) for converting the read out charge into a voltage, which is connected with the FD region 206. Note that a wiring layer for connecting the FD region 206 with the source follower amplifier 204, that is, the wiring layer 105 shown in FIG. 1 is described as an example of the conductive layer of the present invention. However, the present invention is not limited to the wiring layer for connecting the FD region 206 with the source follower amplifier 204, and a conductive layer may be used as long as being provided on the element isolation layer. In addition, reference numeral 205 denotes a row selection MOS transistor which connects the output of the source follower amplifier with a signal line. The signal charge from the photo diode 201 is transferred to the floating diffusion (FD) region 206 through the transfer MOS transistor 203 and inputted to the gate of the source follower amplifier (MOS transistor) 204 connected with the FD region 206. Then, a signal voltage-converted by the source follower amplifier (MOS transistor) 204 is outputted through the row selection MOS transistor 205. Reference mark □ in FIG. 2 denotes a contact hole.

Figure 4:
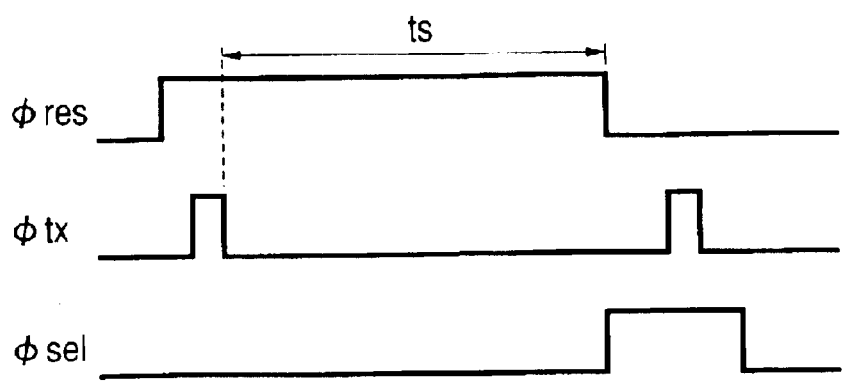
FIG. 4 is a timing chart for the photoelectric conversion device of the present invention.

Next, circuit operation will be described using FIGS. 3 and 4. FIG. 4 is a timing chart showing an example of a method of driving the photoelectric conversion device of the present invention. In FIG. 4, reference symbols ø tx, ø res, and ø sel denote a control signal for controlling on/off of the transfer MOS transistor 203, a control signal for controlling on/off of the reset transistor 202, and a control signal for controlling on/off of the row selection MOS transistor 205, respectively.

In order to reset the photo diode 201 shown in FIG. 3, the reset transistor 202 and the transfer MOS transistor 203 are set to an ON state so that the photo diode 201 is reset. Thereafter, the transfer MOS transistor 203 is set to an OFF state. From this time, the photo diode 201 is brought into a storage state. After a storage period ts is elapsed, the reset transistor 202 is set to an OFF state and the row selection MOS transistor 205 is set to an ON state so that the source follower amplifier 204 becomes an activated state. In this state, when the transfer MOS transistor 203 is set to an ON state, the signal charge of the photo diode 201 is read out.

During the storage state, the FD region 206 becomes a HIGH level state in which Vdd, for example, a voltage of $^+5$ V, is applied thereto, and a gate potential of the MOS transistor 204 and a gate potential of the reset transistor 202 as shown in FIG. 2 are in a HIGH level state. This state is described using FIG. 1. When a potential of the wiring layer 105 becomes a HIGH level, in the case where the dark current reducing region of the present invention is not formed, a concentration of the P+ type channel stop region 106 is effectively reduced in a region under the wiring layer 105 so that the concentration of a minority carrier becomes higher than that in a portion of the region 106 over which the wiring layer 105 is not formed. Thus, there is the case where the generated minority carrier is diffused into the photo diode 201 to deteriorate an S/N.

In contrast to this, when the dark current reducing region 108 of the present invention is provided under the wiring layer 105, the concentration of the minority carrier can be suppressed in a state in which the minority carrier is generated under the wiring layer 105. Thus, a dark current stored in the photo diode 201 due to the diffusion from the P+ type channel stop region 106 can be reduced so that a sensor having a high S/N can be realized as compared with the case where the dark current reducing region 108 does not exist.

The concentration of the dark current reducing region 108 depends on a thickness of the element isolation layer 104, its relative dielectric constant, a work function of a material of the wiring layer 105, and the like, but it is preferably higher than that of the P+ type channel stop region 106. When a minority carrier density of the P+ type channel stop region 106 is given by Np1, it is desirable that a relationship between Np1 and a minority carrier relationship between Np1 and a minority canier density Np2 of the dark current reducing region 108 is Np1≧Np2 at the time when a potential of the wiring layer 105 becomes a HIGH level. For example, when a substrate is made of Si (silicon), a majority carrier concentration of the P+ type channel stop region 106 is $1 \times 10^{17}$ cm$^{-3}$, the element isolation layer is made of SiO$_2$ (silicon oxide), and its thickness is 0.35 μm, it is preferable that a majority carrier concentration of the P-type layer of the dark current reducing region 108 is about $3 \times 10^{17}$ cm$^{-3}$.

Note that there is an effect only when the dark current reducing region 108 located in a portion of a region just under the wiring layer 105 as shown in FIG. 1.

Figure 5:
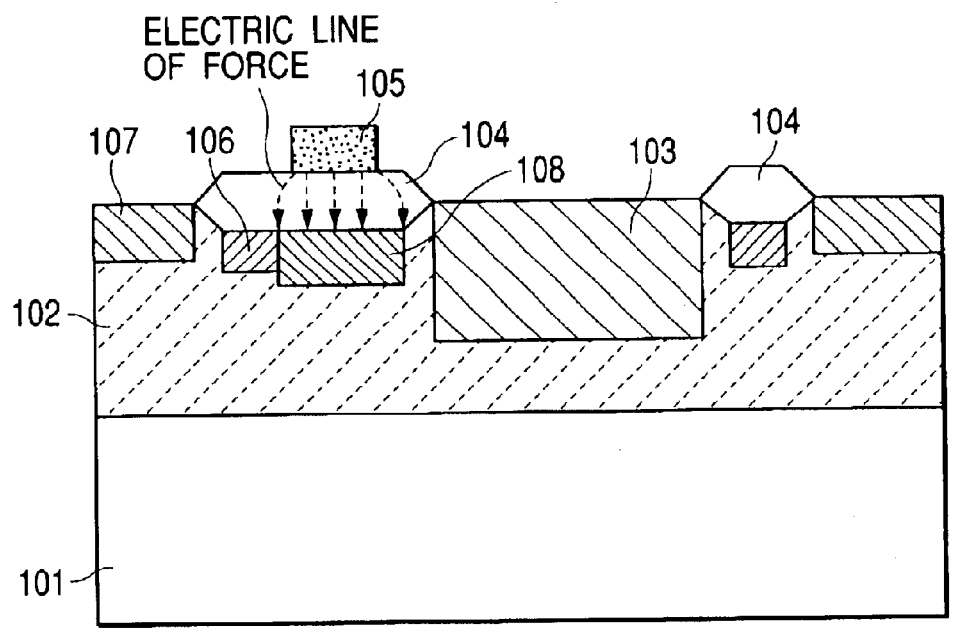
FIG. 5 is a schematic sectional view of a modified example of Embodiment 1 of the photoelectric conversion device of the present invention.
Figure 6:
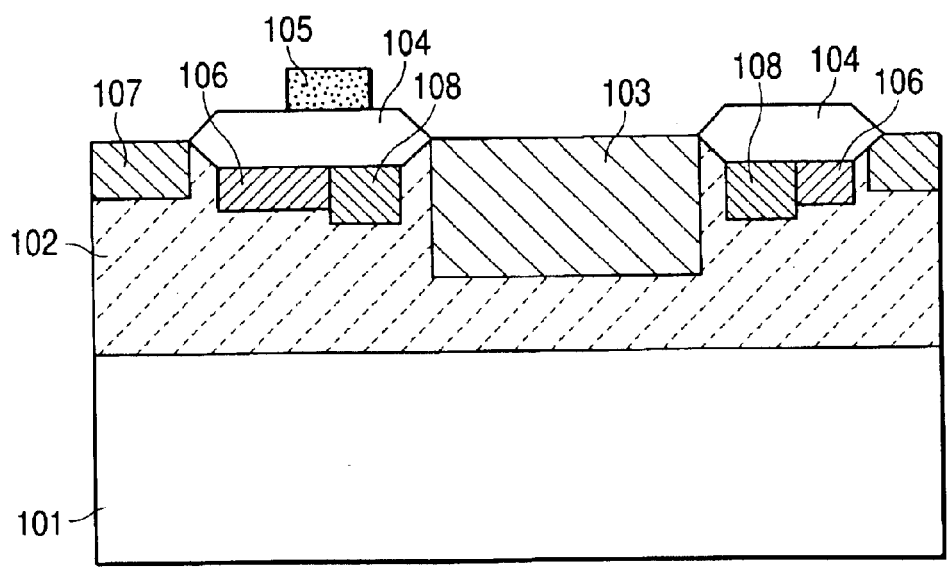
FIG. 6 is a schematic sectional view of another modified example of Embodiment 1 of the photoelectric conversion device of the present invention.

FIGS. 5 and 6 are schematic sectional views showing other examples of the photoelectric conversion device of the present invention. In FIGS. 5 and 6, the same symbols are provided for portions similar to previously described portions.

FIG. 5 is different from FIG. 1 at a point in which the dark current reducing region 108 includes a region opposite to the wiring layer 105 through the element isolation layer interposed therebetween. Thus, of electric lines of force generated toward the substrate side at a time when a potential of the wiring layer 105 is a HIGH level, electric lines of force which are generated in both end portions of the wiring layer 105 and spread in a horizontal direction are terminated to the P+ type channel stop region 106 so that an increase in minority carrier can be suppressed and it is superior to FIG. 1 in view of suppressing a dark current.

FIG. 6 is different from FIG. 1 at a point in which the dark current reducing region 108 protrudes to only the photo diode side. It is needless to say that a dark current is suppressed even when this example is used.

Note that, there is no problem even when the dark current reducing region 108 is formed in a region over which the wiring layer 105 is not formed, as shown in FIG. 6. In addition, it may be formed in a region in which a potential of the wiring layer 105 is a LOW level during a storage period. However, as shown in any drawing, it is desirable that a portion of the P+ type channel stop region 106 is interposed between the source drain region 107 as a high concentration N$^{++}$ region and the dark current reducing region 108 or a P-layer having a lower concentration than the dark current reducing region 108 is formed therebetween, thereby forming a layer for relaxing an electric field between a junction of N$^{++}$ and P+ to improve a junction withstand voltage or to reduce a leak current. This is particularly important with respect to an N$^{++}$ region composing a portion of the floating diffusion region 206 which holds photo charges produced from the photo diode, and it is more desirable that a portion of the P+ type channel stop region 106 is sandwiched between the dark current reducing region 108 and the source drain region 107 or the P-layer having a lower concentration than the dark current reducing region 108 is formed therebetween. It is preferable that a distance between the source drain region 107 and the dark current reducing region 108 is desirably 0.2 μm or more, more desirably, 0.3 μm to 0.4 μm.

Also, the photo diode shown in this embodiment may be applied to a buried type photo diode in which a P$^+$ layer is formed in the surface of the N-type semiconductor region 103.

Figure 15:
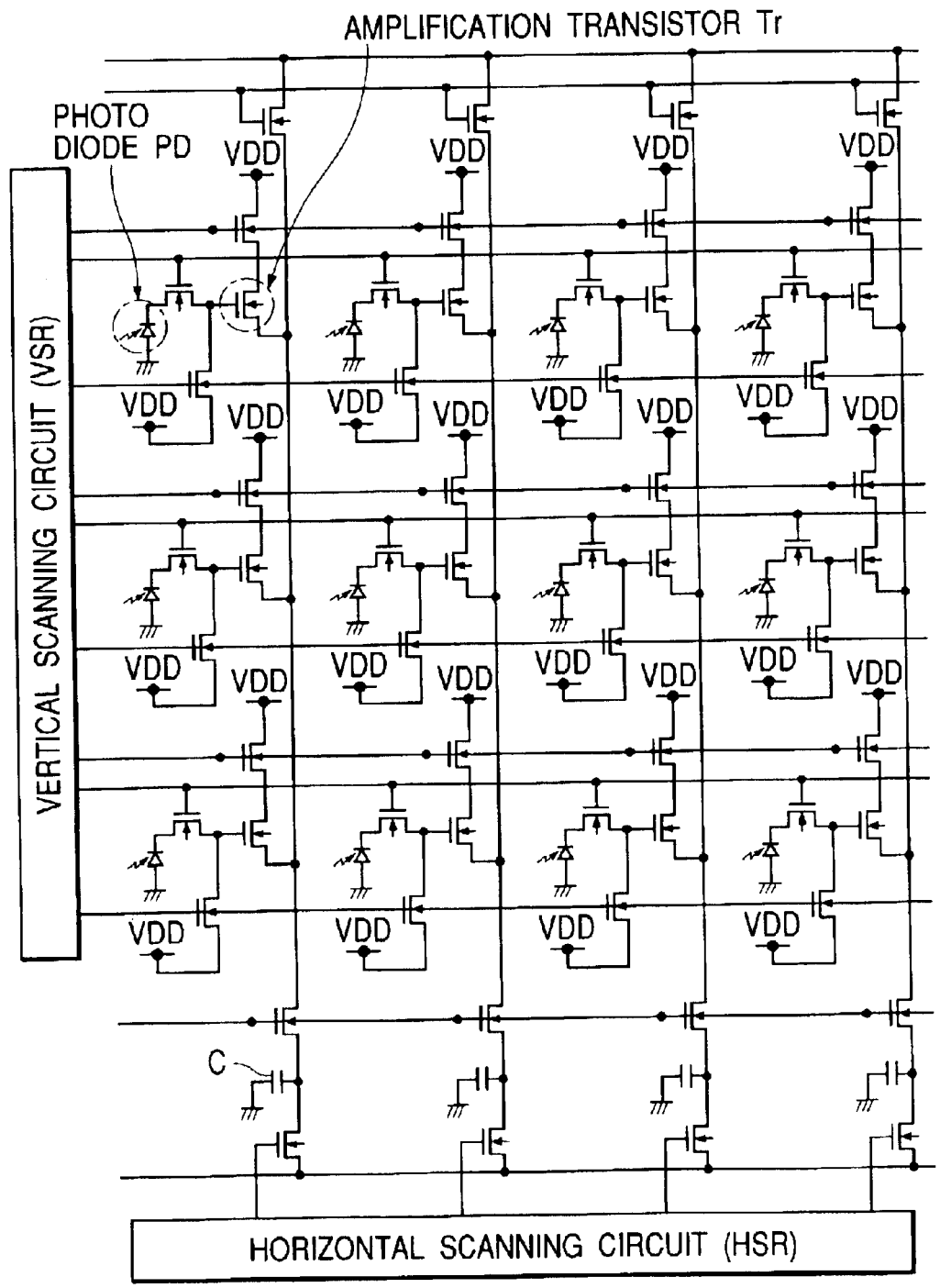
FIG. 15 is a circuit structural diagram of a conventional amplification type solid state image pickup element.
Figure 16:
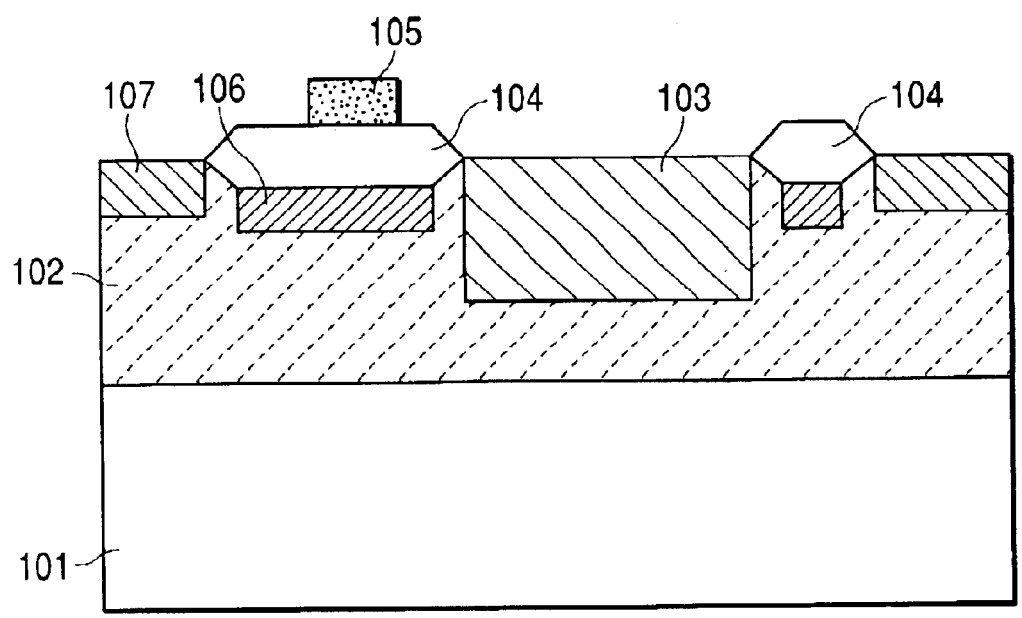
FIG. 16 is a schematic sectional view of a conventional photoelectric conversion device.

Also, these photoelectric conversion devices can be arranged in a two dimensional array as shown in FIG. 15. In addition, the circuit in which 3×4 unit pixels are arranged is shown in FIG. 15. However, according to the present invention, the number of pixels and the circuit construction of the unit pixel are not limited to those. Of course, various modifications and embodiments can be made without departing from the spirit of the present invention.

Also, in this embodiment, the first conductivity type is set to a P-type and the second conductivity type is set to an N-type. Of course, the first conductivity type may be set to an N-type and the second conductivity type may be set to a P-type.

Embodiment 2

Figure 7:
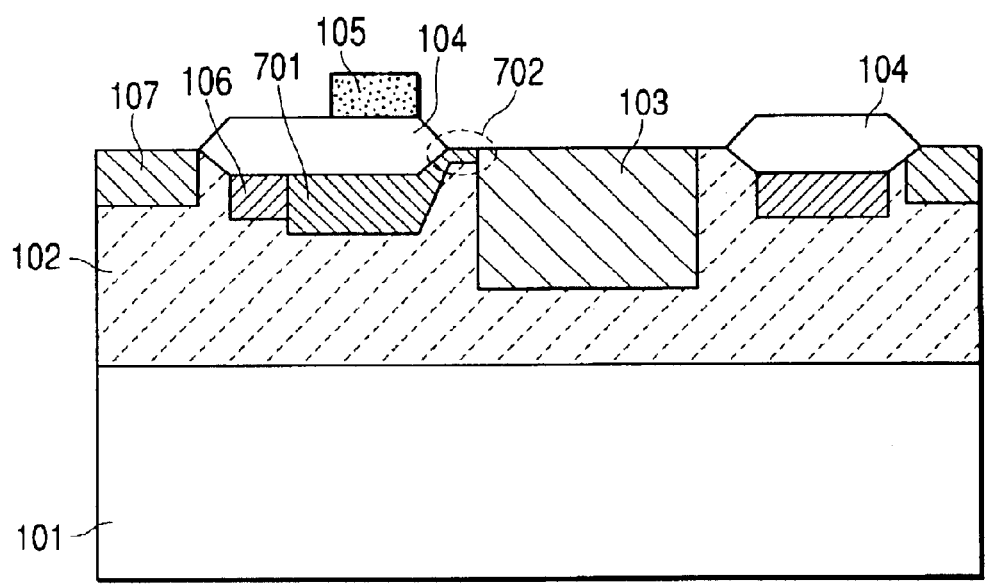
FIG. 7 is a schematic sectional view of Embodiment 2 of a photoelectric conversion device of the present invention.

FIG. 7 is a schematic sectional view showing a Embodiment 2 of a photoelectric conversion device of the present invention. The feature of this embodiment is that a dark current reducing region 701 is extended to a portion of the photo diode as indicated by a region 702. Note that the same symbols are provided for the same structural members as in FIG. 1.

As described using FIG. 5, it is desirable that a shape of the dark current reducing region is formed to include a region opposite to the wiring layer 105 through the element insulation insulating layer. However, for example, when the wiring layer 105 is formed close to the photo diode on the element insulation insulating layer 104, it is desirable that the dark current reducing region protrudes to the photo diode side as indicated by the region 702 without staying in the opposite region to the wiring layer 105 through the element insulation insulating layer 104 sandwiched therebetween.

Figure 8:
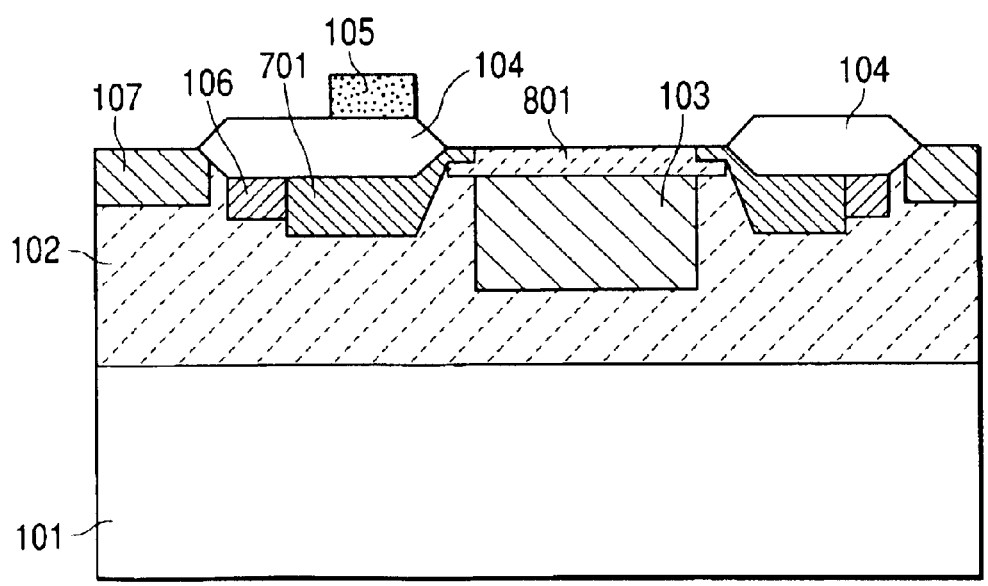
FIG. 8 is a schematic sectional view of a modified example of Embodiment 2 of the photoelectric conversion device of the present invention.

FIG. 8 is a schematic sectional view of a photoelectric conversion device to which a buried type photo diode in which a P+ layer 801 is formed in the surface of the photo diode of the photoelectric conversion device as shown in FIG. 7 is applied. As shown in FIG. 8, the dark current reducing region 701 is extended and formed on the end portions of the P+ layer 801.

Here, processes of forming the photoelectric conversion device in which the dark current reducing region 701 is formed as shown in FIG. 8 will be described using FIGS. 9A and 9B.

Figure 9A:
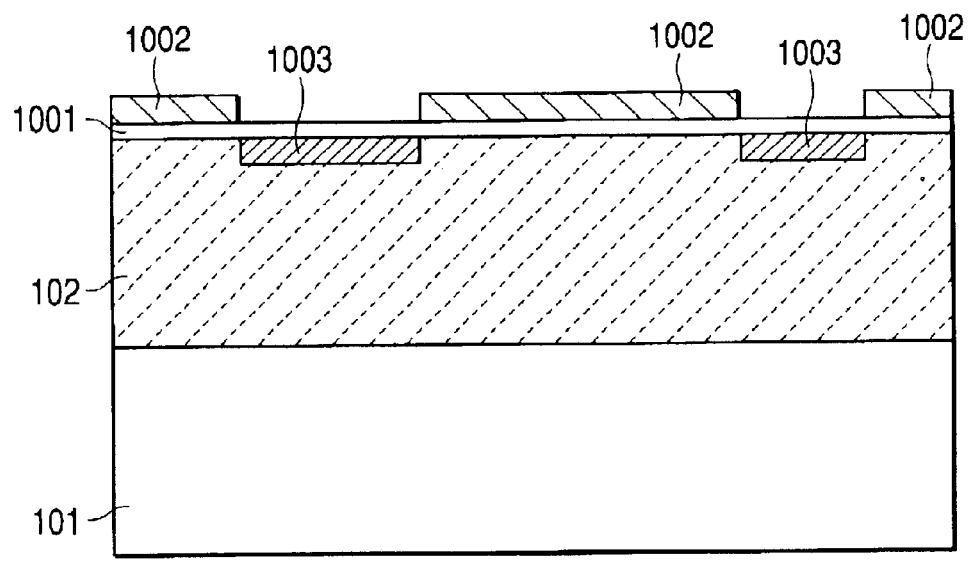
FIGS. 9A and 9B are formation process views of the photoelectric conversion device of the present invention as shown in FIG. 8.

According to the process shown in FIG. 9A, a P-type semiconductor region 102 is formed on the surface of the n-type semiconductor substrate 101 and a sacrificial oxide layer 1001 is grown at, for example, 200 angstroms on its surface. Thereafter, a silicon nitride (Si$_3$N$_4$) layer 1002 is deposited at 1500 angstroms, and then the silicon nitride layer 1002 is patterned by a general photolithography technique using a mask for element isolation. In such a pattern, an impurity which becomes the P+ type channel stop regions 106 in a self-aligning manner, for example, a boron (B$^+$) ion is implanted into regions 1003 at $1.5 \times 10^{13}$ cm$^{-2}$ and 60 keV.

Figure 9B:
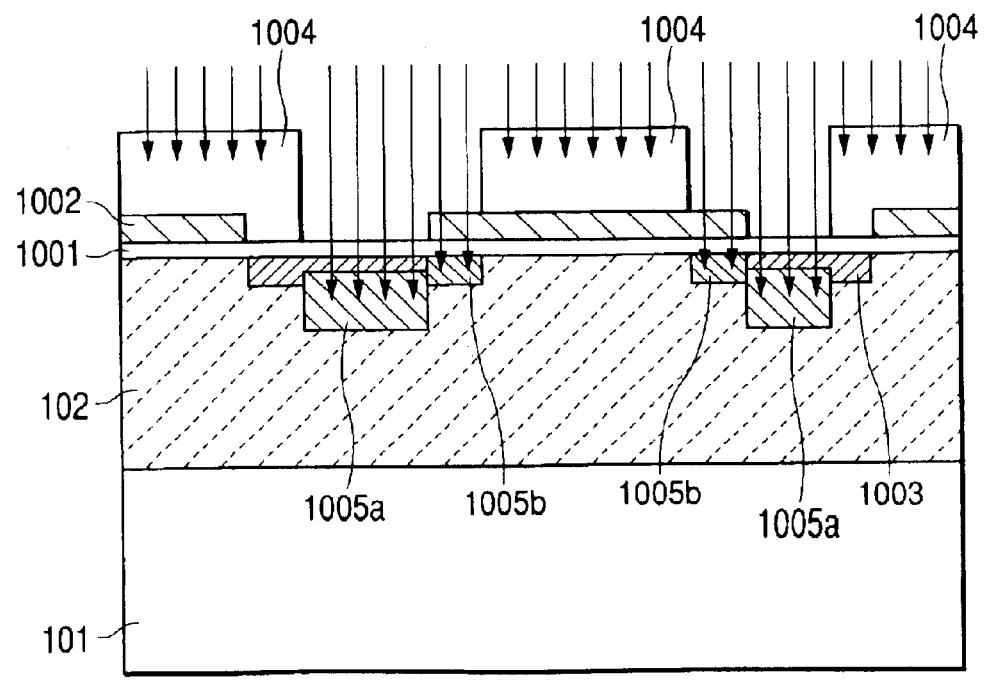

Next, according to the process shown in FIG. 9B, after resist coating, patterning is conducted to form a resist region 1004. With this state, when a boron (B$^+$) ion is implanted in a condition in which the sacrificial oxide layer 1001 and the silicon nitride layer 1002 are penetrated through, for example, in a condition of 135 keV and $3 \times 10^{13}$ cm$^{-2}$, deep regions are formed as indicated by regions 1005a in a portion in which only the sacrificial oxide layer 1001 exists. With respect to a portion in which both the sacrificial oxide layer 1001 and the silicon nitride layer 1002 exist, shallow regions are formed as indicated by regions 1005b. Thereafter, the resist region 1004 is peeled off and a selective oxide layer is formed to form the dark current reducing region 701 shown in FIG. 8.

Figure 10:
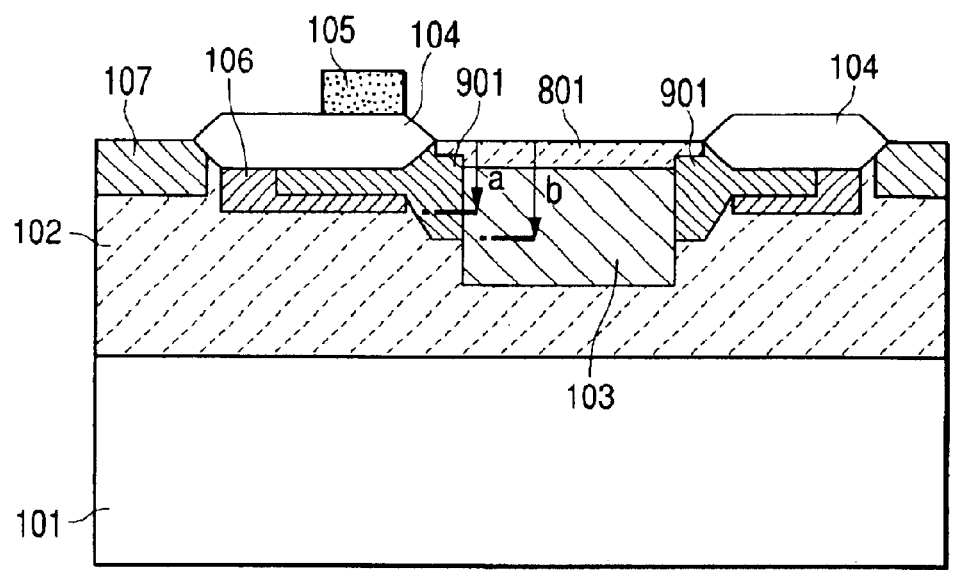
FIG. 10 is a schematic sectional view of another modified example of Embodiment 2 of the photoelectric conversion device of the present invention.

FIG. 10 is a schematic sectional view showing an example in which a dark current reducing region is formed in a more suitable shape in the photoelectric conversion device of the present invention. The dark current reducing region is formed deep in the photo diode side. At this time, a depth b of a region of a dark current reducing region 901 which is in contact with the photo diode is deeper than a depth (distance from surface) of the P+ type channel stop region 106 indicated by a in the drawing. When such a dark current reducing region 901 is formed, as compared with Embodiment 1, a potential barrier is produced for a few minority carriers generated immediately under the wiring layer 105 50 that the amount of carrier diffused into the photo diode can be further reduced.

Figure 11:
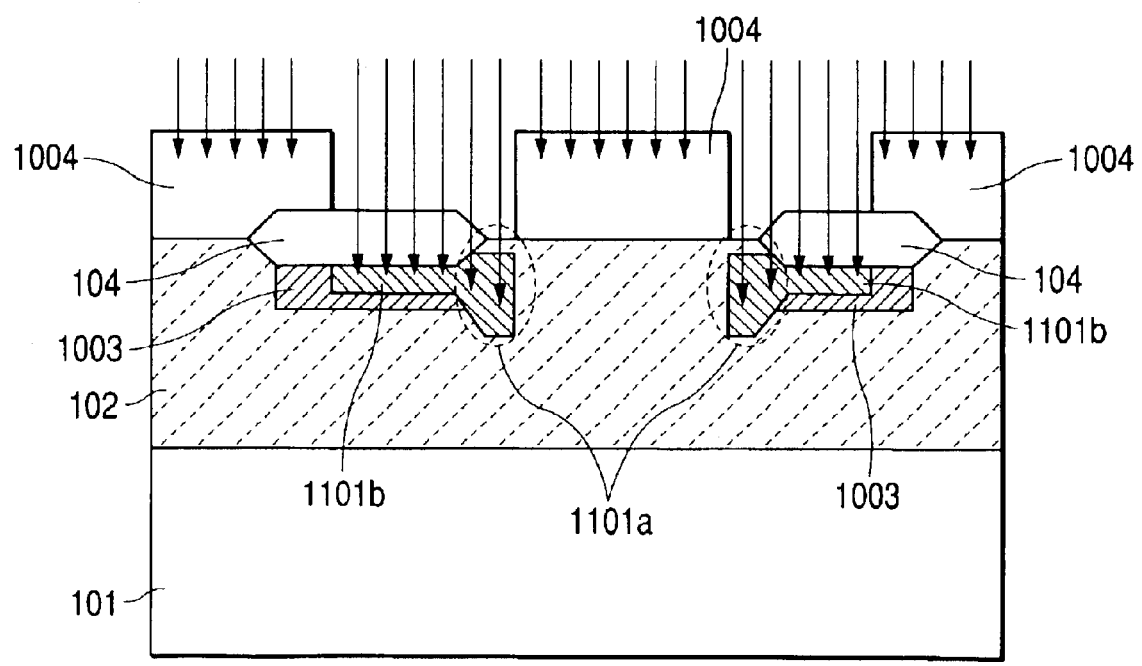
FIG. 11 is a formation process view of the photoelectric conversion device of the present invention as shown in FIG. 10.

FIG. 11 is a sectional view showing a process of forming the dark current reducing region shown in FIG. 10. First, the P+ type regions 1003 are formed using the same process as the process shown in FIG. 9A. Thereafter, the selective oxide layer 104 is formed at, for example, 4000 angstroms and necessary portions are patterned using a resist to form the resist region 1004. Then, a boron (B+) ion is implanted in a condition in which the selective oxide layer 104 is penetrated through, for example, in a condition of 135 keV. Thus, a structure in which a portion 1101a in which a shape of the dark current reducing region 901 is deep in the photo diode side and a portion 1101b in which it is shallow in the selective oxide layer 104 side are simultaneously formed is obtained. Further, although not shown, the N-type semiconductor region 103, an N++ layer of the source drain region 107, and the like are formed to form the shape shown in FIG. 10. Note that examples in which the N-type semiconductor region 103 of the photo diode and the dark current reducing region 701 or 901 are in directly contact with each other are shown in FIGS. 7, 8, and 10. However, they may be close to each other and are not necessarily in contact with each other.

Embodiment 3

Figure 12:
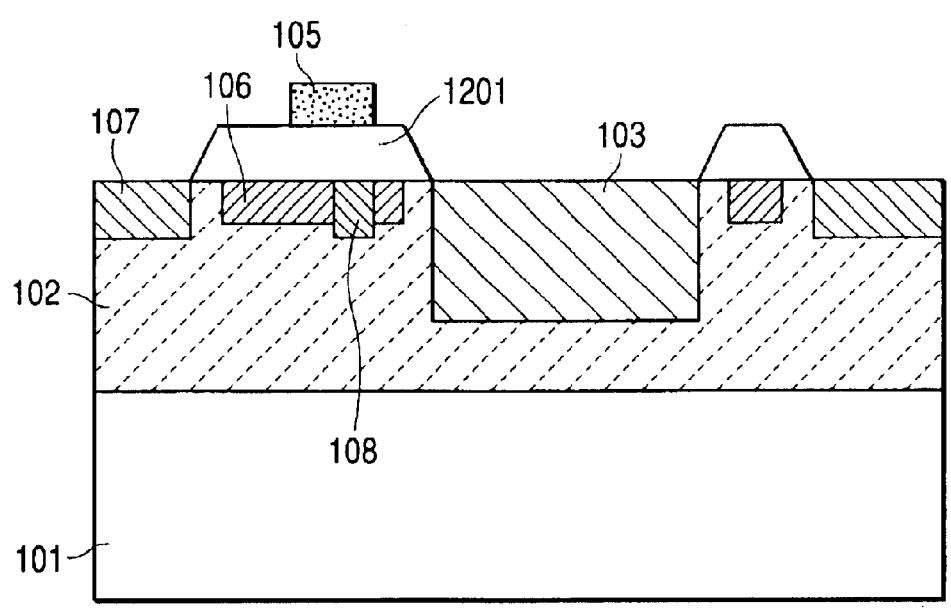
FIG. 12 is a schematic sectional view of Embodiment 3 of a photoelectric conversion device of the present invention.

FIG. 12 shows Embodiment 3 of a photoelectric conversion device of the present invention. In FIG. 12, reference numeral 1201 denotes an element isolation layer formed by mesa isolation. Other structures are the same as in Embodiment 1 shown in FIG. 1. Note that a dark current reducing region may be any one of dark current reducing regions with respective shapes as described in Embodiment 2.

Even in this embodiment, the same effect as in Embodiments 1 and 2 of the present invention is obtained.

Embodiment 4

Figure 13:
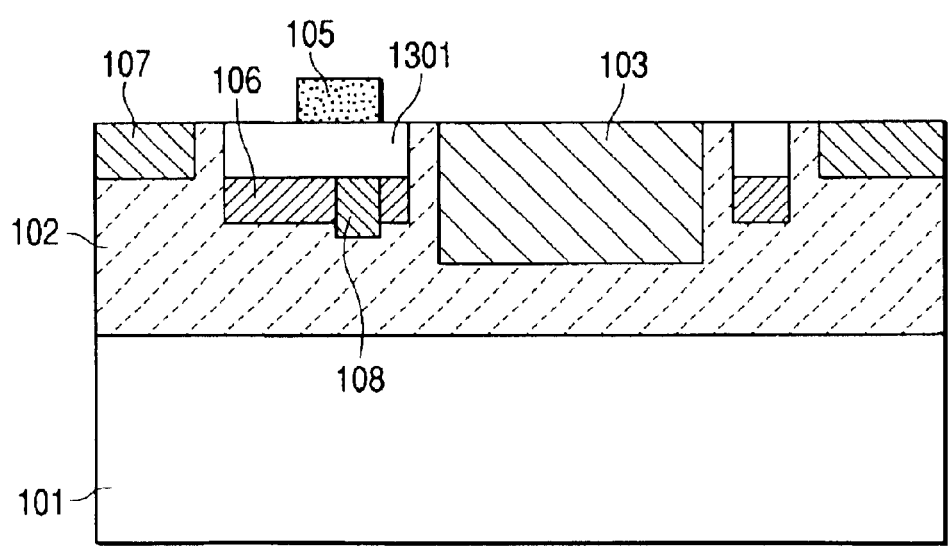
FIG. 13 is a schematic sectional view of Embodiment 4 of a photoelectric conversion device of the present invention.

FIG. 13 shows Embodiment 4 of a photoelectric conversion device of the present invention.

In FIG. 13, reference numeral 1301 denotes an element isolation layer formed by trench isolation. As an example of trench isolation, there may be employed shallow trench isolation (STI).

Note that other structures are the same as in Embodiment 1 shown in FIG. 1. Further, a dark current reducing region 108 shown in this embodiment may be any one of dark current reducing regions with respective shapes as described in Embodiment 2.

Even in this embodiment, the same effect as in Embodiments 1 and 2 of the present invention is obtained.

Embodiment 5

Hereinafter, an embodiment of an image pickup device of the present invention will be described.

Figure 14:
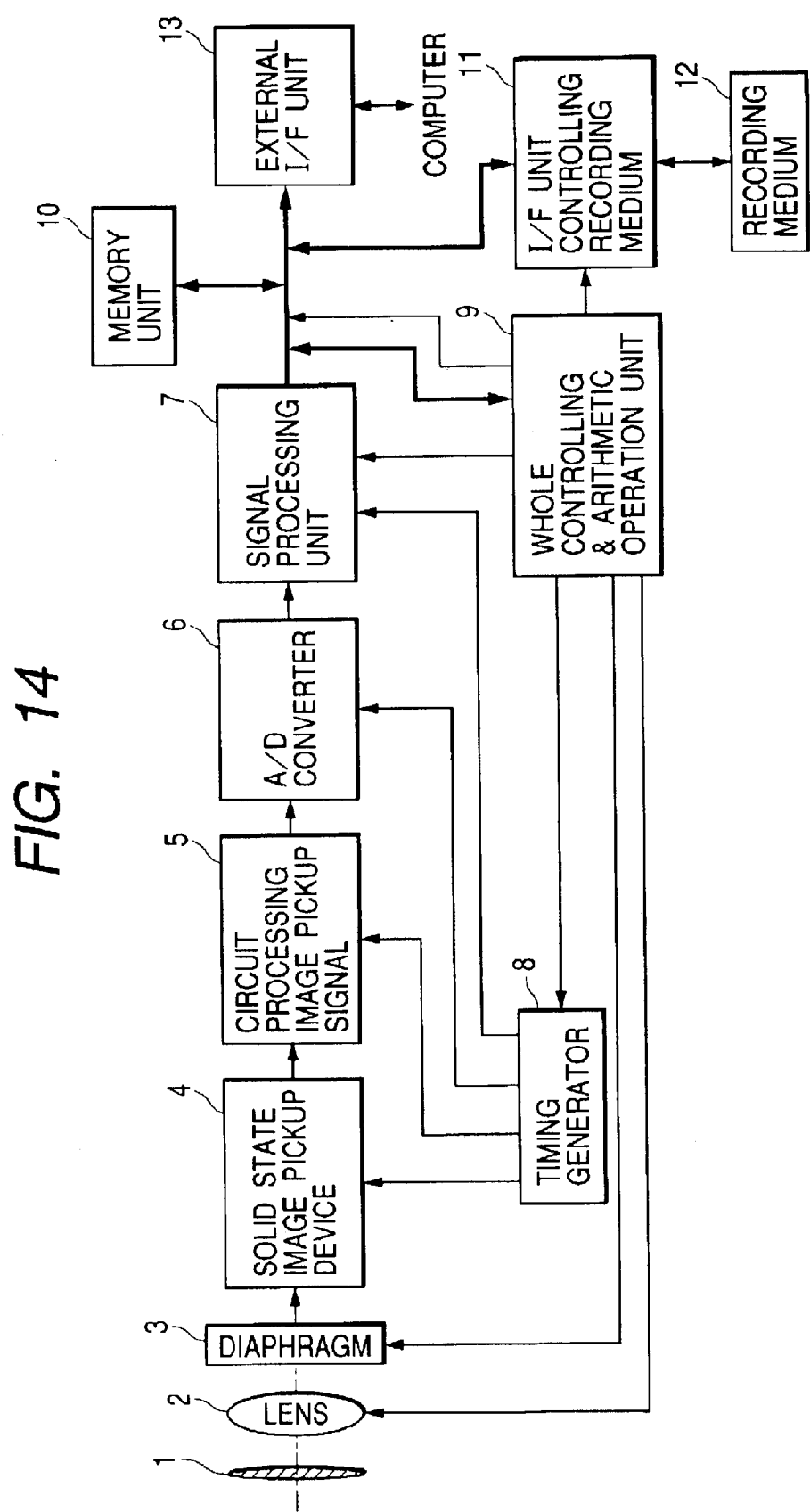
FIG. 14 shows a system of an image pickup device of the present invention.

FIG. 14 is a system structural view of an image pickup device using the photoelectric conversion device of each embodiment described above, as an image pickup device of the present invention. An image pickup device includes a barrier 1 for protecting a lens, a lens 2 for imaging an optical image of an object into a solid state image pickup element 4, a diaphragm 3 capable of changing the amount of light transmitted through the lens 2, the solid state image pickup element 4 for capturing the object imaged by the lens 2 as an image signal (which is composed by arranging the photoelectric conversion devices described in the above respective embodiments in one dimensional or two dimensional matrix), an image pickup signal processing circuit 5 for conducting processings such as various corrections and a clamp to the image signal outputted from the solid state image pickup element 4, an A/D converter 6 for conducting analog-to-digital conversion to the image signal outputted from the solid state image pickup element 4, a signal processing unit 7 for conducting various corrections to the image signal outputted from the A/D converter 6 and compressing the data, and a timing generator 8 for outputting various timing signals to the solid state image pickup element 4, the image pickup signal processing circuit 5, the A/D converter 6, and the signal processing unit 7. Note that the respective circuits, that is, the image pickup signal processing circuit 5, the A/D converter 6, the signal processing unit 7, and the timing generator 8 may be formed on the same chip as the solid state image pickup element 4. In addition, a solid state image pickup system includes a whole controlling and arithmetic operation unit 9 for controlling various arithmetic operations and a whole still video camera, a memory unit 10 for temporally storing the image data, a recording medium controlling interface unit 11 for conducting recording or readout to a recording medium, a detachable recording medium 12 such as a semiconductor memory for conducting recording or readout of the image data, and an external interface (I/F). unit 13 for conducting communication with an external computer or the like.

Note that the barrier 1 may serve as a main switch.

Hereinafter, an image pickup device in which the barrier 1 also serves as a main switch will be indicated as an example and its operation will be described using FIG. 14. When the barrier 1 is opened, a main power source is turned on, a control system power source is next turned on, and a power source for image pickup system circuits such as the A/D converter 6 is further turned on. Then, in order to control the amount of exposure, the whole controlling and arithmetic operation unit 9 causes the diaphragm 3 to open. A signal outputted from the solid state image pickup element 4 is outputted to the A/D converter 6 through the image pickup signal processing circuit 5. The A/D converter 6 conducts A/D-conversion to the signal and outputs it to the signal processing unit 7. The signal processing unit 7 conducts processes the signal and outputs a data to the whole controlling and arithmetic operation unit 9. The whole controlling and arithmetic operation unit 9 conducts exposure arithmetic operation based on the data.

Brightness is determined in accordance with the photometric result, and the whole controlling and arithmetic operation unit 9 controls the diaphragm 3 according to the determination result. Next, a high frequency component is extracted from the signal outputted from the solid state image pickup element 4, and arithmetic operation of a distance to the object is conducted by the whole controlling and arithmetic operation unit 9. Thereafter, the lens 2 is actuated and it is determined whether or not focus is achieved. When it is determined that focus is not achieved, the lens 2 is actuated again and distance measurement is conducted.

Then, after it is confirmed that focus is achieved, main exposure is started. When the exposure is completed, the image signal outputted from the solid state image pickup element 4 is corrected by the image pickup signal processing circuit 5, A/D-converted by the A/D converter 6, and stored in the memory unit 10 through the signal processing unit 7 by the whole controlling and arithmetic operation unit 9. Thereafter, data stored in the memory unit 10 is recorded in the detachable recording medium 12 such as a semiconductor memory through the recording medium controlling I/F unit 11 under the control of the whole controlling and arithmetic operation unit 9. In addition, the data may be directly inputted to a computer or the like through the external I/F unit 13 to conduct image processing.

What is claimed is:

1. A semiconductor device comprising:
    semiconductor elements each having a first semiconductor region of a first conductivity type and a second semiconductor region of a second conductivity type which is formed in the first semiconductor region;
    an element isolation layer formed between one semiconductor element and another semiconductor element adjacent to the one semiconductor element;
    a conductor layer formed on a portion of the element isolation layer;
    a third semiconductor region of the first conductivity type having a higher impurity concentration than the first semiconductor region, and being formed at a side of the element isolation layer opposite to the conductor layer;
    a fourth semiconductor region of the first conductivity type having a higher impurity concentration than the third semiconductor region, wherein a portion of the element isolation layer is sandwiched between the conductor layer and the fourth semiconductor region; and
    a fifth semiconductor region of the second conductivity type being formed in the first semiconductor region at a side of the element isolation layer opposite to the second semiconductor region, and having no direct connection to the fourth semiconductor region.

2. A semiconductor device according to claim 1, wherein the one semiconductor element is a photoelectric conversion element.

3. A semiconductor device according to claim 2, wherein at least a portion of the conductor layer is used for conducting voltage applying operation for increasing a minority carrier concentration in the third semiconductor region during at least a part of a period for which the photoelectric conversion element stores a signal.

4. A semiconductor device according to claim 1, wherein the fifth semiconductor region has a function for holding a charge of the photoelectric conversion element.

5. A semiconductor device according to claim 2, wherein all of the fourth semiconductor region is formed in a region opposite to the conductor layer.

6. A semiconductor device according to claim 2, wherein a portion of the fourth semiconductor region is close to or in contact with the second semiconductor region.

7. A semiconductor device according to claim 6, wherein a depth of the portion of the fourth semiconductor region which is close to or in contact with the second semiconductor region is deeper than a depth of the third semiconductor region, with the depths being measured with reference to a surface of the second semiconductor region.

8. A semiconductor device according to claim 2, wherein the photoelectric conversion element is a buried type photo diode in which a semiconductor region of the first conductivity type is formed in a surface of the second semiconductor region.

9. A semiconductor device according to claim 1, wherein the element isolation layer is an insulating layer formed by a selective oxidation method.

10. A semiconductor device according to claim 1, wherein the element isolation layer is an insulating layer patterned into a mesa shape.

11. A semiconductor device according to claim 1, wherein the element isolation layer is an insulating layer formed by trench isolation.

12. A semiconductor device according to claim 2, further comprising an amplification transistor for amplifying a signal from the photoelectric conversion element.

13. A semiconductor device according to claim 2, wherein the semiconductor device is arranged among a plurality of semiconductor devices arranged in a one-dimensional or two-dimensional matrix.

14. An image pickup device comprising:
    (i) a semiconductor device comprising:
        semiconductor elements each having a first semiconductor region of a first conductivity type and a second semiconductor region of a second conductivity type which is formed in the first semiconductor region;
        an element isolation layer formed between one semiconductor element and another semiconductor element adjacent to the one semiconductor element;
        a conductor layer formed on a portion of the element isolation layer;
        a third semiconductor region of the first conductivity type having a higher impurity concentration than the first semiconductor region, and being formed at a side of the element isolation layer opposite to the conductor layer;
        a fourth semiconductor region of the first conductivity type having a higher impurity concentration than the third semiconductor region, wherein a portion of the element isolation layer is sandwiched between the conductor layer and the fourth semiconductor region; and
        a fifth semiconductor region of the second conductivity type being formed in the first semiconductor region at a side of the element isolation layer opposite to the second semiconductor region, and having no direct connection to the fourth semiconductor region,
        wherein the one semiconductor element is a photoelectric conversion element;
    (ii) an optical system for imaging an image into the semiconductor device; and
    (iii) means for storing an image signal from the semiconductor device.

15. A photoelectric conversion device comprising:
    photoelectric conversion elements, each forming a pixel and having a first semiconductor region of a first conductivity type and a second semiconductor region of a second conductivity type which is formed in the first semiconductor region;
    an element isolation layer formed between one photoelectric conversion element and another photoelectric conversion element adjacent to the one photoelectric conversion element;
    a conductor layer formed on a portion of the element isolation layer;
    a third semiconductor region of the first conductivity type having a higher impurity concentration than the first semiconductor region, and being formed at a side of the element isolation layer opposite to the conductor layer;

a fourth semiconductor region of the first conductivity type having a higher impurity concentration than the third semiconductor region, wherein a portion of the element isolation layer is sandwiched between the conductor layer and the fourth semiconductor region; and a fifth semiconductor region of the second conductivity type being formed in the first semiconductor region, and having a higher impurity concentration than the second semiconductor region, wherein the fifth semiconductor region operates as a floating diffusion region for holding a photo carrier generated from a photoelectric conversion element of a pixel different from that of the second semiconductor region and has no direct connection to the fourth semiconductor region.

16. A semiconductor device according to claim 6, wherein the depth of the portion of the fourth semiconductor region which is close to or in contact with the second semiconductor region is deeper than a depth of another portion of the fourth semiconductor region disposed at the side of the element isolation layer opposite to the conductor layer, with the depths being measured with reference to a surface of the second semiconductor region.

17. A camera comprising:

(i) a semiconductor device comprising:
   semiconductor elements each having a first semiconductor region of a first conductivity type and a second semiconductor region of a second conductivity type which is formed in the first semiconductor region;
   an element isolation layer formed between one semiconductor element and another semiconductor element adjacent to the one semiconductor element;
   a conductor layer formed on a portion of the element isolation layer;
   a third semiconductor region of the first conductivity type having a higher impurity concentration than the first semiconductor region, and being formed at a side of the element isolation layer opposite to the element isolation layer;
   a fourth semiconductor region of the first conductivity type having a higher impurity concentration than the third semiconductor region, wherein a portion of the element isolation layer is sandwiched between the conductor layer and the fourth semiconductor region; and
   a fifth semiconductor region of the second conductivity type being formed in the first semiconductor region at a side of the element isolation layer opposite to the second semiconductor region, and having no direct connection to the fourth semiconductor region,
   wherein the one semiconductor element is a photoelectric conversion element;

(ii) an optical system for imaging an image into the semiconductor device; and (iii) means for storing an image signal from the semiconductor device,
   wherein the element isolation layer is an insulating layer formed by a selective oxidation method.

* * * * *

UNITED STATES PATENT AND TRADEMARK OFFICE
CERTIFICATE OF CORRECTION

PATENT NO. : 6,774,453 B2
DATED : August 10, 2004
INVENTOR(S) : Akira Okita

It is certified that error appears in the above-identified patent and that said Letters Patent is hereby corrected as shown below:

<u>Title page,</u>
Item [57], ABSTRACT,
Line 1, "device" should read -- device which --.
Line 15, "and wiched there between" should read -- sandwiched therebetween --.

<u>Column 3,</u>
Line 38, "of," should read -- of --.

<u>Column 4,</u>
Line 44, "⁺5" should read -- +5 --.

<u>Column 5,</u>
Line 9, "canier" should read -- carrier --.

<u>Column 8,</u>
Line 49, "conducts" should be deleted.

Signed and Sealed this

Eleventh Day of January, 2005

JON W. DUDAS
*Director of the United States Patent and Trademark Office*